United States Patent
Brown

(10) Patent No.: US 6,908,314 B2
(45) Date of Patent: Jun. 21, 2005

(54) TAILORED INTERCONNECT MODULE

(75) Inventor: Paul Brown, Wakefield (CA)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/618,629

(22) Filed: Jul. 15, 2003

(65) Prior Publication Data

US 2005/0014397 A1 Jan. 20, 2005

(51) Int. Cl.⁷ .............................................. H01R 12/00
(52) U.S. Cl. ...................................................... 439/68
(58) Field of Search ................................. 257/685, 684, 257/723, 724, 738, 774, 777, 778, 686, 691; 361/761, 762, 767, 766, 704; 439/68, 71, 67; 438/109, 107, 122, 14–18; 428/209

(56) References Cited

U.S. PATENT DOCUMENTS 6,677,668 B1 * 1/2004 Lin ............................. 257/685

* cited by examiner

Primary Examiner—Alexander Gilman
(74) Attorney, Agent, or Firm—Jim Zegeer

(57) ABSTRACT

An integrated circuit interconnect module for reducing interconnections between integrated circuit chips MOUNTED ON a support substrate. At least one primary integrated circuit (IC) device chip and a plurality of interacting peripheral integrated chip devices. The interconnect module including a plurality of interface pins, each integrated circuit device having a plurality of interface ports. At least one interface port of which is connected to another one of said plurality of integrated circuit devices, at least one of said integrated circuit devices having an interface port connected to an interface pin whereby the majority of nodes on the interacting peripheral devices are adapted to interface with nodes of the primary IC devices in such a way as to condense the number of nets so that the total number of nodes connected to external pins is minimized.

3 Claims, 1 Drawing Sheet

TAILORED INTERCONNECT MODULE

BACKGROUND AND BRIEF DESCRIPTION OF THE INVENTION

The invention is directed to the problem of alleviating routing constraints on boards having high pin count devices e.g. devices with a pin count in excess of 1000 pins.

Current ASIC packaging uses a 1 mm spacing (pitch) between pins, which allows maximum package pin counts to be in the order of 2000 pins. Next generation packaging technology is expected to reduce this pitch to 0.8 mm in 2003 and to 0.65 mm by 2005. These pitches will enable packages of 2500 and 3000 pin counts to be implemented, respectively. However, as pin counts increase with decreasing pitch, routing circuit board connections (traces) to the pins becomes more difficult. This is because the pins are arranged in a grid, and with 0.65 mm to 1 mm spacing between pins, there is room enough to route only a single trace between pins. Consequently, multiple layer (or multi-layer) circuit boards are used, wherein each layer provides routing access to a row or two of pins in the grid. For example, a package having a 50×50 grid of pins could require as much as a 35-layer circuit board to route connections to all of its pins. Such high-layer count boards are beyond the range of standard multi-layer board technology, and would therefore be difficult to design, costly to manufacture and risky to use.

So-called "System in Package" (SiP) and multi-chip modules (MCM) are known in the prior art. System in package systems are provided by entities selling services in the design, assembly and test of subsystems. In such designs, one benefits through reduction in routing complexities which results in some degree of simplification. However, simple integration is not sufficient to achieve the kind of gains that are achieved by the present invention. Certain requirements, constraints related to the interconnecting nodes of subsystems must be in place to achieve the substantial difference.

Development of multichip modules tends to be driven by a need to obtain an improvement in device performance. To this end, bare die are integrated on a substrate and packaged in a single package to form a module. Performance improvements using this technology are mainly obtained by having the die in the same package, which leads to shorter connections having more accurately controlled impedances. Although the development of multi-chip modules was not driven by a necessity to reduce routing complexity of circuit boards, the resulting modules have fewer I/O pins than the die that comprise them, thereby alleviating circuit board routing constraints.

Since multi-chip modules incorporate bare die, which often cannot be tested at full operational speed, there is a possibility that some of the die in a module are faulty. Unfortunately, since testing at full operational speed can only be done on a module, if a die in a module is faulty then this will only be discovered when the module is tested. However, since the modules cannot be reworked easily, a faulty die will cause an entire module to be scrapped. Consequently, the production yield of modules is related to the product of the individual yields of its component die. Hence, as the die count in a module increases its production yield decreases. This relationship has made multi-chip modules expensive to produce, and therefore they tend to be used only in cases where they are needed to meet performance requirements.

BRIEF DESCRIPTION OF THE INVENTION

The present invention provides a tailored interconnect module which provides the interconnect reduction as its major objective along with functionality and design rules in place to support this. According to the invention, the interconnects on the module are configured and adapted to facilitate a high degree of local routing, i.e. the majority of the nodes on the peripheral devices are designed to interface with the nodes of one or more central devices (ASICs) processors, etc.) in such a way as to condense the number of nets so that the total number of nodes connected to external pins is minimized. The same is true for the power and ground pins of the device. Rather than simply supplying each device in question, they can be pooled to a set of local reference pins for distribution to the other devices from this central localized reference pin. In the extreme, the present invention can be leveraged to the point where all the interconnects will be contained locally and the number of pins existing the package could be reduced to as low as one directional pin. In practice, the invention can be leveraged to reduce the total pin count from 4000 pins approximately to 500 pins.

This invention integrates fully tested devices in chip scale packages into a single package, thereby trading-off intra-device performance of multi-chip modules for an improvement in manufacturing yield. The resulting reduced pin count alleviates routing constraints, which allows a circuit board with fewer layers to be used.

In most cases, only one or two high pin count devices (e.g. a network processor) dictate the number of board layers required for routing. An example application would be to integrate a network processor and its supporting memory chips into a tailored interconnect module. In this case, use of the tailored interconnect module could reduce the required circuit board layers from 35 layers to 20 layers, which would allow the circuit board to be implemented in standard circuit board technology, thereby reducing costs and improving the reliability of the board. Other applications would be to create generic tailored interconnect module components for performing common functions such as data/signal processing, supplying power, etc.

An alternative to solely using devices in chip scale packages in the tailored interconnect module would be to use a combination of packaged and bare die. This alternative could still provide the same benefits to yields and routing where the bare die could be tested at speed, i.e. where different parts of the tailored interconnect module operate at different speeds.

The invention features a tailored interconnection device having a plurality of interface pins for connection to external circuitry, a plurality of integrated circuit devices mounted inside the package. Each integrated circuit device has a plurality of interface ports, at least one interface port being connected to another one of the plurality of integrated circuit devices. At least one of the integrated circuit devices has an interface port connected to an interface pin; and at least one of the integrated circuit devices is packaged in a chip scale package. In some embodiments some of the integrated circuit devices are not in chip scale packages but have been tested at their full operational speed. In another embodiment at least one of the integrated circuit devices is a network processor and at least one of the other devices is a memory device. In another embodiment the interconnections between the devices have different impedances.

The invention further features an integrated circuit interconnect module for reducing interconnections between fully tested integrated circuit chips comprising a support substrate having mounted thereon at least one primary integrated circuit device chip and a plurality of interacting peripheral integrated chip devices. The interconnect module has a plurality of interface pins. Each integrated circuit device has a plurality of interface ports, at least one of which is connected to another one of said plurality of integrated circuit devices, at least one of the integrated circuit devices having an interface port connected to an interface pin whereby the majority of nodes on the peripheral devices are adapted to interface with nodes of one or more primary devices in such a way as to condense the number of nets so that the total number of nodes connected to external pins is minimized.

DESCRIPTION OF THE DRAWINGS

The above and other objects, advantages and features of the invention will become more clear when considered with the following specification and accompanying drawings wherein.

DETAILED DESCRIPTION OF THE INVENTION

Figure 1:
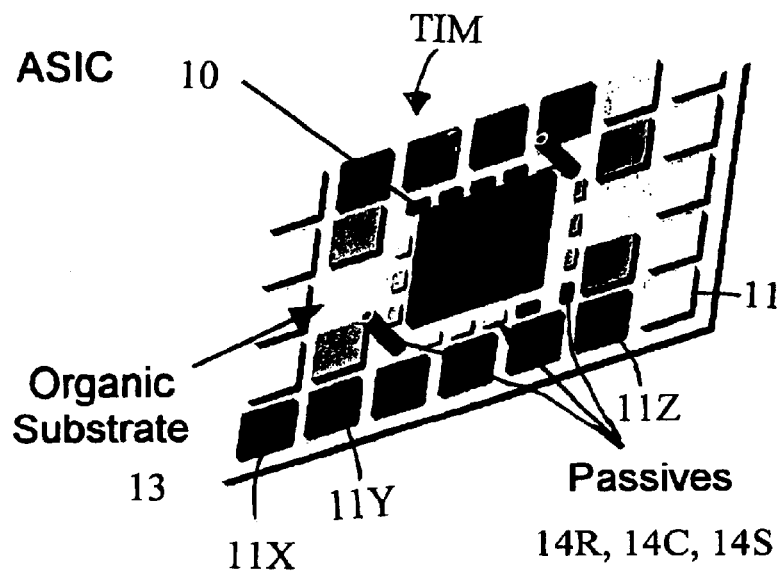
FIG. 1 is an isometric view of a tailored interconnect module incorporating the invention.

As discussed above, the tailored interconnect module device of the present invention seeks to reduce the number of interface pins coming to the module. Referring to FIG. 1, the tailored interconnect module (TIM) includes, for example, at its center, an application specific integrated circuit (ASIC) 10 which is surrounded by integrated circuit (IC) devices 11M, 11W, 11X, 11Y, 11Z, etc. which may be memory or functional devices in chip scale packages or bare die auxiliary devices. They are mounted on an organic substrate 13. Passive elements 14R, 14C, 14S, etc. such as resistors and capacitors, etc. may also be mounted on substrate 13.

Figure 2:
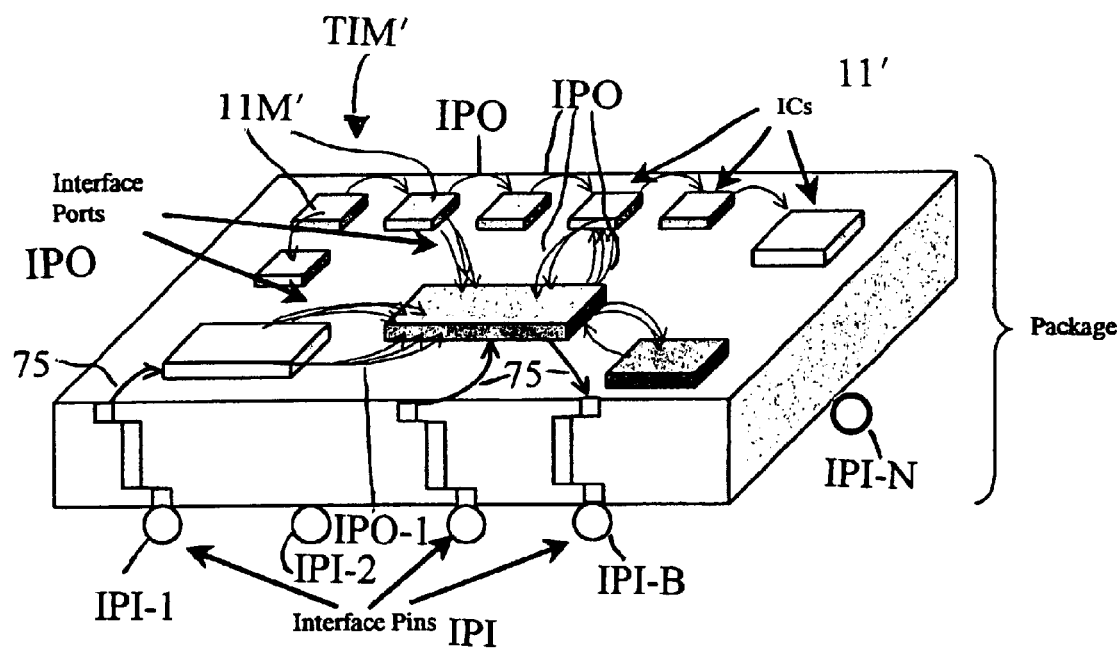
FIG. 2 is a schematic isometric functional view of a tailored interconnect module incorporating the invention.

Referring now to FIG. 2, the ASIC 10' is provided with connections for both interface ports IPO and interface pins IPI. In accordance with the practice of this invention, at least one bidirectional interface pin IPI-b is required as a minimum connection to the outside world for a useful tailored interconnect module according to the invention. Each integrated circuit device 11' has a plurality of interface ports IPO which are interconnected into a system.

The module shown in FIG. 2 has a plurality of interface pins IPI-1, IPI-2, IPI-3 . . . IPI-N and a plurality of integrated circuit devices mounted inside the package. Each integrated circuit package device 11' has a plurality of interface ports IPO-1, IPO-2, IPO-3 . . . IPO-N, at least one interface port IPO-1 being connected to another one of the plurality of integrated circuit devices 11'. At least one of the integrated circuit devices 11' has an interface port IPO-4 connected to an interface pin IPI and at least one of the integrated circuit devices 11' is packaged in a chip scale package. As illustrated in FIG. 2, the primary communications between the onboard integrated circuit chips 11' and the interface pins IPI for the package TIM' are designated by the connection lines 75 between the onboard integrated circuit chips 11 and the interface pins IPI. The secondary arrows SA represent secondary or intermediate communications between the onboard integrated circuit chips 11' and through the interface ports designated by the lines IPO. Note in particular that in this embodiment, the interface pins IPI connected to the onboard integrated circuits are significantly fewer than the intermediate communications or secondary communications between the onboard integrated circuit 11' and through the interface ports IPO.

According to the invention, the interconnects on the module are configured and adapted to facilitate a high degree of local routing, i.e. the majority of the nodes on the peripheral devices 11 are designed to interface with the nodes of one or primary devices 10' (ASICs) processors, etc.) in such a way as to condense the number of nets so that the total number of nodes connected to external pins IPI is minimized. The same is true for the power and ground pins of the device. Rather than simply supplying each device 11' in question, they can be pooled to a set of local reference pins for distribution to the other devices from this localized reference pin. In the extreme, the present invention can be leveraged to the point where all the interconnects will be contained locally and the number of pins existing the package could be reduced to as low as one directional pin. In practice, the invention can be leveraged to reduce the total pin count from 4000 pins approximately to 500 pins.

Main Advantages

1. Enables circuit boards to be routed using fewer board layers, thereby allowing standard board technology to be used, which reduces the cost and design time of the circuit cards, while increasing product reliability.
2. Unlike prior art multi-chip modules, which integrated several partially tested bare die in a single package, the tailored interconnect module integrates fully tested devices in chip scale packages in a single package, thereby trading-off intra-device performance for an improvement in manufacturing yield.

Other Advantages reduced footprint (estimated up to 60% less than current techniques)

improved electrical performance over individually packaged components (estimated 40% reduction in trace length)

single known good element leading to savings in assembly, test, and debugging.

One of the main commercial value of the invention stems from the alleviation of board routing constraints, which would allow a circuit board with considerably fewer layers to be used. This would result in reduced design (routing) time, lower production costs, and improved reliability of the circuit board. Further improvements include a reduction in required circuit board real estate and a better electrical performance, which would enable the inclusion of more system features and provide better system performance, respectively. Therefore, utilizing tailored interconnect module technology would make them more competitive. Furthermore if ASIC and ASSP pin counts continue to rise at the rate that they have on switching products, new designs will not be realizable with current board technology, thereby necessitating new design solutions such as the tailored interconnect module disclosed herein.

While the invention has been described in relation to preferred embodiments of the invention, it will be appreciated that other embodiments, adaptations and modifications of the invention will be apparent to those skilled in the art.

What is claimed is:

1. A tailored integrated circuit interconnect module for reducing interconnections between fully tested integrated circuit chips comprising a support substrate having mounted thereon at least one primary integrated circuit device chip and a plurality of interacting peripheral integrated chip devices, said interconnect module including a plurality of interface pins, each integrated circuit device having a plurality of interface ports, at least one of which is connected to another one of said plurality of integrated circuit devices, at least one of said integrated circuit devices having an interface port connected to an interface pin whereby the majority of nodes on said peripheral devices are adapted to interface with nodes of said at least one primary integrated chip device in such a way as to condense the number of nets so that the total number of nodes connected to external pins is minimized.

2. The tailored integrated circuit interconnect module defined in claim 1 wherein said primary integrated circuit chip device is a network processor and at least one of said other devices is a memory device.

3. The tailored integrated interconnect module device defined in claim 1 wherein the interconnections between said devices have different impedances.

* * * * *